(12) United States Patent
He

(10) Patent No.: US 8,731,635 B2
(45) Date of Patent: May 20, 2014

(54) COILS FOR MAGNETIC RESONANCE SPECTROSCOPY AND IMAGING OF HUMAN BREAST

(75) Inventor: Qiuhong He, Wexford, PA (US)

(73) Assignee: University of Pittsburgh—Of the Commonwealth System of Higher Education, Pittsburgh, PA (US)

( * ) Notice: Subject to any disclaimer, the term of this patent is extended or adjusted under 35 U.S.C. 154(b) by 791 days.

(21) Appl. No.: 12/266,007

(22) Filed: Nov. 6, 2008

(65) Prior Publication Data

US 2009/0118611 A1 May 7, 2009

Related U.S. Application Data

(60) Provisional application No. 60/986,253, filed on Nov. 7, 2007.

(51) Int. Cl.
*A61B 5/05* (2006.01)

(52) U.S. Cl.
USPC ............................................ 600/410; 600/422

(58) Field of Classification Search
None
See application file for complete search history.

(56) References Cited

U.S. PATENT DOCUMENTS

| | | | |
|---|---|---|---|
| 5,256,971 A * | 10/1993 | Boskamp | 324/318 |
| 5,416,413 A | 5/1995 | Leussier | |
| 5,577,504 A * | 11/1996 | Salloway et al. | 600/410 |
| 5,646,530 A | 7/1997 | Strenk et al. | |
| 6,169,399 B1 | 1/2001 | Zhang et al. | |
| 6,404,199 B1 * | 6/2002 | Fujita et al. | 324/318 |
| 6,696,889 B2 | 2/2004 | Watanabe | |
| 2004/0183534 A1* | 9/2004 | Chan et al. | 324/318 |
| 2005/0215882 A1 | 9/2005 | Chenevert et al. | |
| 2007/0016003 A1* | 1/2007 | Piron et al. | 600/415 |

FOREIGN PATENT DOCUMENTS

EP  0338624  * 10/1989  ............. G01N 24/04

OTHER PUBLICATIONS

Surface Coil, http://www.magnetic-resonance.org/MagRes%20Chapters/03_13.htm, MR instrumentation, chapter 3, p. 13, Mar. 6, 2002.*
Kroger, 510(k), K983139, Feb. 19, 1999, Signa 1.5 T Phosphorus Transmit/Receive Flex Coil, GE Medical Systems.*
Hawk et al., Double Tuned Cosine coil for NMR imaging/Spectroscopy, Procedding Arkansas Academy of Science, vol. 45, 1991.*
King et al., MR Spectroscopy Using Multi-Ring Surface Coils, Magnetic Resonance in Medicine 42:655-664, 1999.*
Styles et al., A Concentric Surface-Coil Probe for the Production of Homogeneous B1 Fields, Journal of Magnetic Resonance 62, 397-405, 1985.*
International Search Report and Written Opinion for PCT Patent Application No. PCT/US2008/082708, mailed Jan. 22, 2009, 10 pages.

* cited by examiner

*Primary Examiner* — Long V. Le
*Assistant Examiner* — Bo J Peng
(74) *Attorney, Agent, or Firm* — Kegler Brown Hill & Ritter; James J. Pingor

(57) ABSTRACT

System(s) and method(s) for magnetic resonance imaging and spectroscopy, and magnetic resonance spectroscopic imaging (MRSI) are provided. A unified heteronuclear coil system includes a volume coil tuned to detect a first nuclei and a butterfly coil tuned to detect a second nuclei for simultaneous detection of both the first nuclei and the second nuclei signals from human breast tissue and perform MRIS. First nuclei and second nuclei each include $^1H$, $^{13}C$, $^{31}P$, $^{23}Na$, and $^{19}F$. The heteronuclear coil system affords detection of NMR-detectable chemicals specific to cancerous breast tissue to improve breast cancer diagnostic specificity. Adjustment of the heteronuclear coil system to detect various nuclei, combined with a specific pulse excitation sequence, facilitates chemical analysis that provides for chemical discrimination and characterization of compounds present in cancerous and other breast tissue as well as healthy breast physiology.

17 Claims, 12 Drawing Sheets

HETERONUCLEAR COIL

TOP VIEW

SIDE VIEW

BUTTERFLY COIL

SINGLE-LOOP TAPE COIL

BUTTERFLY TAPE COIL

VOLUME COIL

¹H VOLUME COIL; 1.5 T

¹H VOLUME COIL; 3.0 T

¹H VOLUME COIL; 9.4 T

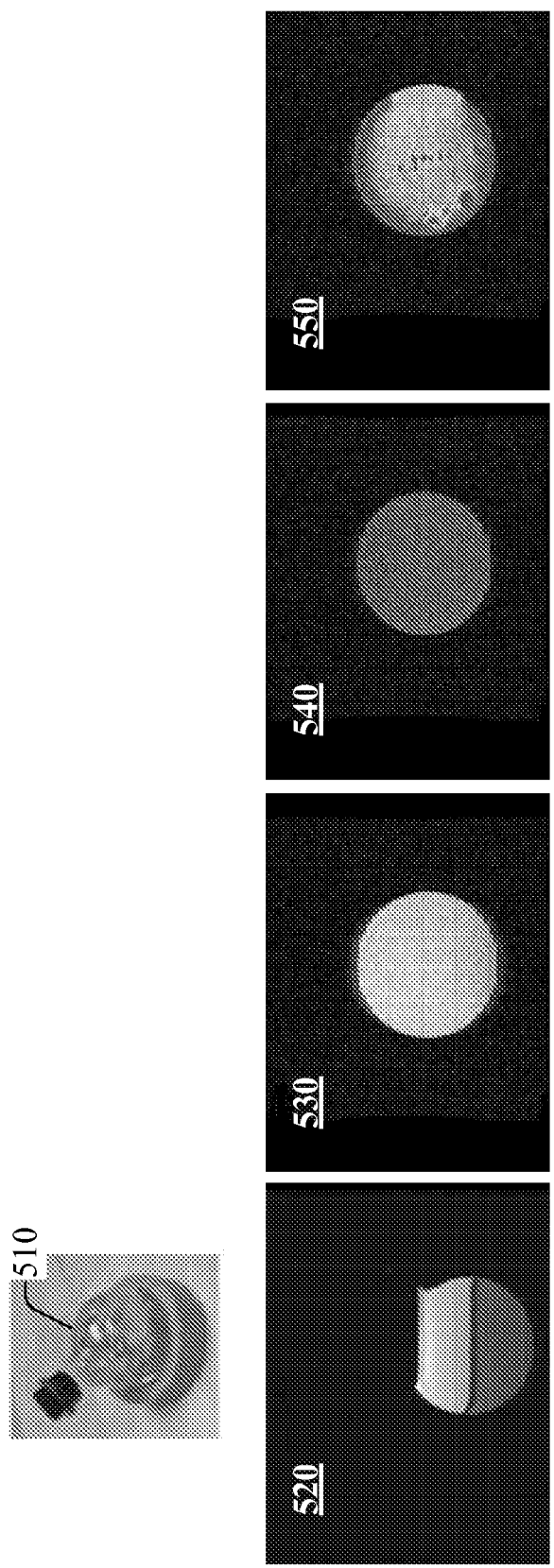
FIG. 5A
FIG. 5B
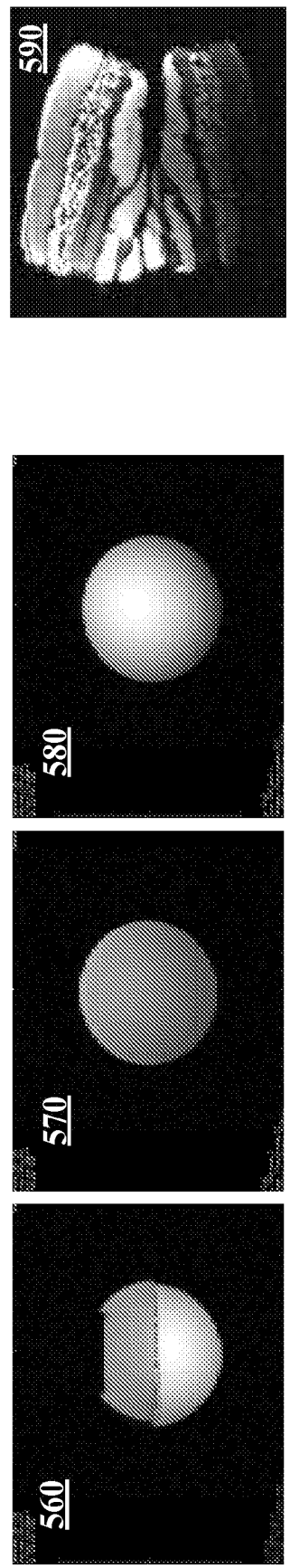
FIG. 5C

COILS FOR MAGNETIC RESONANCE SPECTROSCOPY AND IMAGING OF HUMAN BREAST

CROSS-REFERENCE TO RELATED APPLICATION

This application claims the benefit of U.S. Provisional Application Ser. No. 60/986,253 filed on Nov. 7, 2007, entitled "COILS FOR MAGNETIC RESONANCE SPECTROSCOPY AND IMAGING OF HUMAN BREAST AT HIGH MAGNETIC FIELD." The entirety of this provisional application is incorporated herein by reference.

NOTICE ON GOVERNMENT FUNDING

This invention was made with government support under grants NIH 1R01 CA109471-01 A1 awarded by the National Institutes of Health and NSF REU PHY 0244105 awarded by the National Science Foundation. The government has certain rights in the invention.

TECHNICAL FIELD

The subject innovation relates generally to magnetic resonance spectroscopy and imaging and, more particularly, to design and manufacture of radio frequency transmit/receive heteronuclear coils for magnetic resonance spectroscopy at high and low magnetic fields.

BACKGROUND

Magnetic resonance imaging and spectroscopy is a non-invasive technique that allows probing human soft and hard tissue. In addition to being used as a diagnostic tool, magnetic resonance imaging (MRI) and magnetic resonance spectroscopy (MRS) can be utilized in interventional procedures. While proton MRS and MRI has been employed extensively in brain cancer studies, substantially less research and development has succeeded in breast cancer research through magnetic resonance spectroscopy, in particular at high magnetic fields (e.g., at or above 3 T), albeit breast cancer is the most common malignancy and the number-one leading cause of cancer-related death in women. Each year, nearly 465,000 patients die from breast cancer worldwide, and 1,302,000 more women are newly diagnosed with this disease. Due to its relative good prognosis, nearly 4.4 million breast cancer survivors are living today; however, incidence rates of breast cancer are increasing in most countries. Mortality of breast cancer is mostly associated to metastasis. The current therapeutic interventions typically have limited effect to treat metastatic breast cancer and antiestrogen- chemo- and radiation-resistant tumors. Therefore, early detection is critical in breast cancer management.

A possible reason for having a lesser volume of breast cancer research and clinical success through MRS is that several disparate techniques are mature and used customarily at the clinic level, even though such techniques have substantive limitations. For instance, a technique readily employed is mammography, yet mammography screening(s) has false positive rate about 70%-80%. Ultrasonography is another technique that is often utilized in conjunction with mammography, however ultrasonography has lower specificity than mammography. Positron emission tomography/computed tomography (PET/CT) is another technique widely utilized and highly sensitive to detect breast cancer and metastasis for tumors larger than 1 cm; sensitivity decreases significantly for smaller tumors.

Regarding MRS and MRI techniques applied to breast cancer, proton MRS and MRI techniques can differentiate benign and malignant breast lesions in vivo. MRI has a high sensitivity (typically greater than 99%) in detecting breast cancer, but low specificity (37%-86%) with a high false-positive rate; MRS can improve breast cancer detection specificity. Currently, choline has been typically the only metabolite that has been observed reliably in human breast cancer by proton MRS, reaching a sensitivity and improved specificity of tumor detection of approximately 78% and 86%, respectively. To further specify, a family of proton MRSI (magnetic resonance spectroscopy imaging) methods based on a selective multiple quantum coherence transfer has been developed. Such technique can achieve complete lipid and water suppression in a single scan, which permits detection of low concentration metabolites, such as lactate, choline, and unsaturated lipid molecules as surrogate biomarkers of breast cancer. In an early patient study, a commercial body coil was used for radio frequency (RF) transmission at 2.1 T with an 8 cm surface coil employed for signal receiving. Experiments have also been conducted with various coil configurations for breast cancer MRI/MRS experiments in 3 T scanners.

Despite the foregoing developments associated with MRS and MRI experimentation, conventional equipment have not harnessed the benefits of high magnetic fields, which include dramatic increase in signal-to-noise ratio and spectral editing efficiency. Therefore, there is a need in the art to develop techniques and hardware that can operate reliably at high magnetic fields and lead to effective diagnosis.

SUMMARY

The following presents a simplified summary of the specification in order to provide a basic understanding of some aspects of the specification. This summary is not an extensive overview of the specification. It is intended to neither identify key or critical elements of the specification nor delineate the scope of the specification. Its sole purpose is to present some concepts of the specification in a simplified form as a prelude to the more detailed description that is presented later.

The subject innovation provides heteronuclear coil system(s) and method(s) for magnetic resonance imaging and spectroscopy of human breast(s) at high magnetic fields. In an aspect, a combined volume $^1$H coil and butterfly $^{13}$C coil is provided as a unified heteronuclear coil system for simultaneous detection of both $^1$H and $^{13}$C signals from human breast tissue. Detection targets presence of NMR-detectable chemicals specific to cancerous breast tissue to improve breast cancer diagnostic specificity. The heteronuclear coil system can be tuned to observe $^{31}$P, $^{23}$Na, $^{19}$F signal, and so forth. By extending coils within the heteronuclear coil system(s) to detection of other nuclei, combined with a specific pulse excitation sequence, chemical analysis can be conducted, providing for chemical discrimination and characterization of compounds present in either cancerous or healthy breast tissue. An example of a $^1$H/$^{13}$C heteronuclear coil system includes a $^1$H volume coil and a $^{13}$C coil, using separate RF channels, wherein the volume coil is an inner coil immersed in an open-space allotted by the outer butterfly coil, and $^1$H and $^{13}$C coils produce mutually perpendicular $B_1$ RF excitation fields. The $^1$H coil includes three parallel copper loops, each loop separated in three segments by two capacitors. The $^1$H volume coil resonates at 297.2 MHz, which corresponds to the Larmor frequency of $^1$H at 7 T. The $^{13}$C coil includes two symmetric loops of rectangular shape, manufactured out of hollow copper wires bent into a butterfly configuration. A tuning/matching circuit is utilized to match and tune the $^1$H volume coil or $^{13}$C butterfly coil to the Larmor frequency at an external field of 7 T and 3 T. Both the butterfly $^{13}$C coil and the volume $^1$H coil were tested successfully to produce a uniform $B_1$ magnetic field.

In addition, within a heteronuclear coil system, either a butterfly coil or a volume coil can be employed individually to detect signal from a single nuclei of interest, or signal from a set of two or more nuclei of interest through multi-tuning (e.g., double-tuning, triple-tuning . . . ) of a single coil to resonate with Larmor frequencies of the two or more nuclei of interest. Moreover, a butterfly coil can be used in MRI/MRS experiment as an extremity coil to study muscle metabolism, arthritis, and so forth.

Features and aspects of the subject innovation can facilitate diagnosis of soft tissue (e.g., breast tissue, joint tissue) disease(s) or monitoring of treatment thereof. Such monitoring can provide almost immediate feedback in connection with treatment effectiveness, which can allow physicians to switch medications (e.g., treatment drugs) when a current medication fails to show improvement in connection with attacking the tumor, or any other soft tissue disease for which the treatment drug is directed to. Expedited feedback can reduce decision making time regarding change(s) from an ineffective drug to an effective drug is greatly reduced, with the ensuing increase in patient outcomes.

The following description and the annexed drawings set forth, in detail, certain illustrative aspects of the innovation. These aspects are indicative, however, of but a few of the various ways in which the principles of the innovation may be employed and the subject innovation is intended to include all such aspects and their equivalents. Other objects, advantages and novel features of the innovation will become apparent from the following detailed description of the innovation when considered in conjunction with the drawings.

BRIEF DESCRIPTION OF THE DRAWINGS

FIGS. 5A, 5B, and 5C illustrate, respectively, magnetic resonance images of a liquid phantom obtained with a butterfly coil tuned to $^{13}$C Larmor frequency resonance at 7 T, which is substantially the same as the $^1$H Larmor frequency at 1.5 T; MRIs of the liquid phantom taken with a volume coil tuned to Larmor frequency of $^1$H at 7 T; and MRI of an animal meat phantom taken with the 1 H volume coil tuned for a Larmor frequency of proton at 7 T.

DETAILED DESCRIPTION

Figure 1:
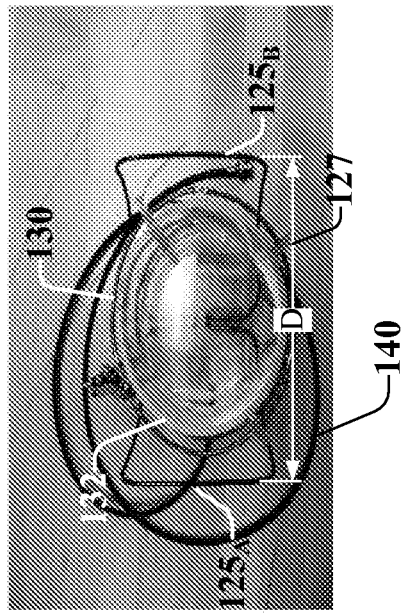
FIG. 1 illustrates an example heteronuclear coil system for MR imaging and spectroscopy of a human breast at high magnetic fields.
Figure 1:
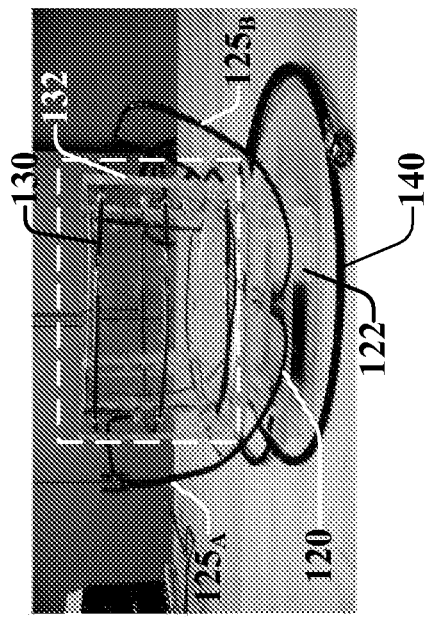

The subject matter is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present innovation.

As used in this application, the terms "component," "system," and the like are intended to refer to an entity that is either hardware, a combination of hardware and software, software, or software in execution. As an example, a component can be an apparatus with specific functionality provided by mechanical elements, an apparatus with specific functionality provided by mechanical parts operated by electric or electronic circuitry operated by a software or firmware application executed by processor, the processor internal or external to the apparatus that executes at least a part of the software or firmware application. In addition, a component can be an apparatus that provides specific functionality through electronic components without mechanical parts, the electronic components can include a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

As discussed in greater detail next, unique system(s) and method(s) for magnetic resonance imaging and spectroscopy, and magnetic resonance spectroscopic imaging (MRSI) are provided. A unified heteronuclear coil system includes a volume coil tuned to detect a first nuclei and a butterfly coil tuned to detect a second nuclei for simultaneous detection of both the first nuclei and the second signals from human breast tissue and perform MRSI. First nuclei and second nuclei each include at least $^1$H, $^{13}$C, $^{31}$P, $^{23}$Na, and $^{19}$F. The heteronuclear coil system affords detection of nuclear magnetic resonance (NMR)-detectable chemicals specific to cancerous breast tissue to improve breast cancer diagnostic specificity. Adjustment of the heteronuclear coil system to detect various nuclei, combined with a specific pulse excitation sequence, facilitates chemical analysis that provides for chemical discrimination and characterization of compounds present in cancerous and other breast tissue as well as healthy breast physiology.

Referring to the drawings, FIG. 1 illustrates two views of an example heteronuclear coil system 100 for MR imagining and spectroscopy of a human breast at high magnetic fields (e.g., 3 T or 7 T). The heteronuclear coil system 100 also can be operated at 1.5 T, which is compatible with 1.5 T MRI scanners ordinarily available in substantially every hospital. Commercial 0.5 T MRI scanners can also employ heteronuclear coils system 100. In an aspect, heteronuclear coil system 100 allows proton (e.g., $^1$H nuclei) and carbon signals (e.g., $^{13}$C nuclei) to be obtained from a same breast tissue in high-field, whole-body MRI scanners for diagnosis and intervention of human breast diseases. Example heteronuclear coil system 100 includes a butterfly coil 120 that is employed as an outer coil, and can be tuned to detect signal(s) from $^{13}$C nuclei, and a volume coil 130 that is utilized as an inner coil and can detect signal(s) from $^1$H nuclei. Butterfly coil 120 and volume coil 130 each are manufactures out of metal wire and each coil includes an electrically insulating (e.g., acrylic) support structure (e.g., structure 122 for butterfly coil 120 and structure 132 for volume coil) to separate the coils from circuitry that facilitates to tune, at least in part, and operate of the coils. It should be appreciated that in the coil configuration of the example heteronuclear coil system 100, butterfly coil 120 (e.g., tuned to $^{13}$C signal(s)) and volume coil 130 (e.g., tuned to $^1$H) generate probe magnetic fields $B_1$ that are mutually perpendicular. Spatial uniformity of field B1 dictates at least in part the spatial resolution that can be achieved with heteronuclear coil system 100. It should be appreciated that sensitivity of a coil (e.g., butterfly coil 120, or volume coil 130) to a specific nucleus at a specific external magnetic field ($B_0$) is determined by matching or tuning the coil's natural resonance frequency, when driven by an RF current, to the Larmor frequency ($v_0$) of a considered nucleus in the external magnetic field ($B_0$): $v_0=\gamma B_0$, where $\gamma$ is the gyromagnetic ratio of the considered nucleus. Accordingly, through geometrical changes in the coils design, example heteronuclear coil system 100 allows for probing multiple combinations A/B of nuclei $N_A$ and $N_B$, beyond $^1$H and $^{13}$C, that are nuclear magnetic resonance (NMR) sensitive. Examples of additional nuclei that can be combined and probed with example heteronuclear coil system 100 are $^{19}$F, $^{23}$Na, and $^{31}$P. Details of the butterfly and volume coils are discussed next, and where convenient for illustrative purposes, reference will be made to FIG. 2 and FIGS. 3A-3C, which are diagrams of a butterfly coil 120 and example volume coil(s), respectively.

Butterfly coil 120 (e.g., tuned to $^{13}$C) presents an open-structure configuration, in which hollow copper wires are bent into a two loops $125_A$ and $125_B$. It should be appreciated that while copper wires are employed in the manufacturing of coil 120, other metals (e.g., aluminum, silver, or gold) can be utilized as well. In example heteronuclear coil 100, butterfly loops $125_A$ and $125_B$ are symmetric and display a rectangular section with a height (H) of 11 cm and a width (W) of 13 cm. The distance D 127 between the upper edges of the two loops $125_A$ and $125_B$ equals 16 cm. Choices of H, W, and D are dictated primarily by application aspects, such as the magnitude of the external magnetic field $B_0$ in which the coil is set to operate; in an aspect, the external magnetic field is provided by a magnet in a whole-body commercial MRI scanner. Additionally, dimensions are affected by quality of operation (QOO) parameters related to the application, such as uniformity of probe magnetic field (commonly indicated as $B_1$ in the art) generated by the coil; resonator quality factor Q, which is determined by selection of a set of capacitive components in a tuning/matching circuit; signal-to-noise ratio during detection; and so forth. Furthermore, size of organs to be probed, e.g., human breasts, and patient comfort also determine, at least in part, the size of butterfly loops in a butterfly coil. It should be noted that other geometrical sections can be employed for butterfly loops in a butterfly coil; for example, circular-section loops can be employed to produce a butterfly coil. Moreover, a single loop in a butterfly coil can be comprised of multiple constituent loops.

Figure 2A:
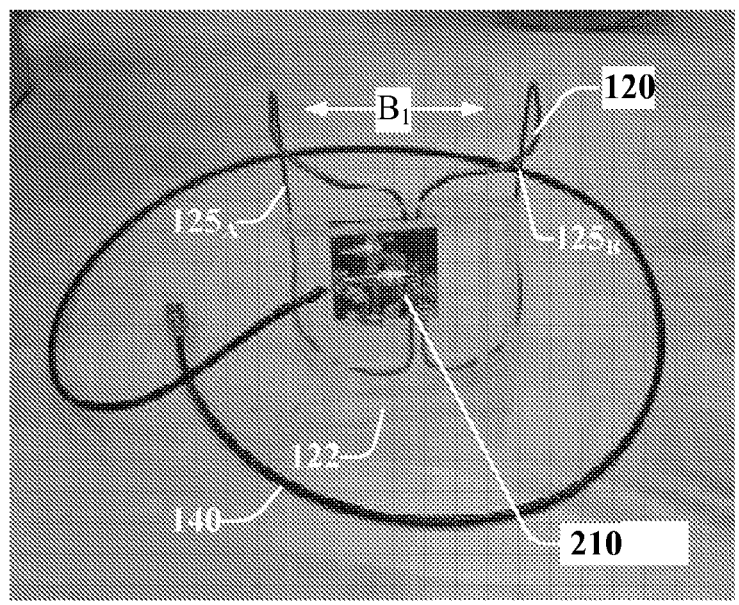
FIGS. 2A-2C illustrate, respectively, an example butterfly coil employed in a heteronuclear coil system, a single-loop flat coil that can be a precursor to a butterfly coil, and two views of a butterfly tape coil in accordance with aspects disclosed in the subject specification.
Figure 2B:
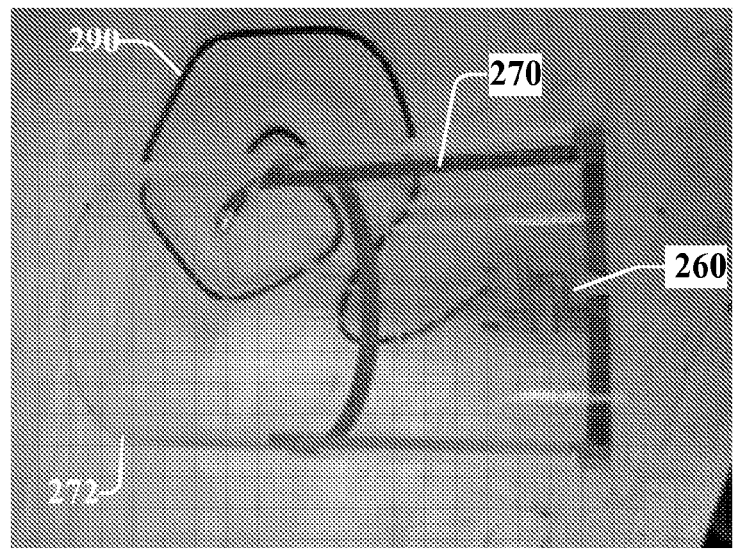
Figure 2C:
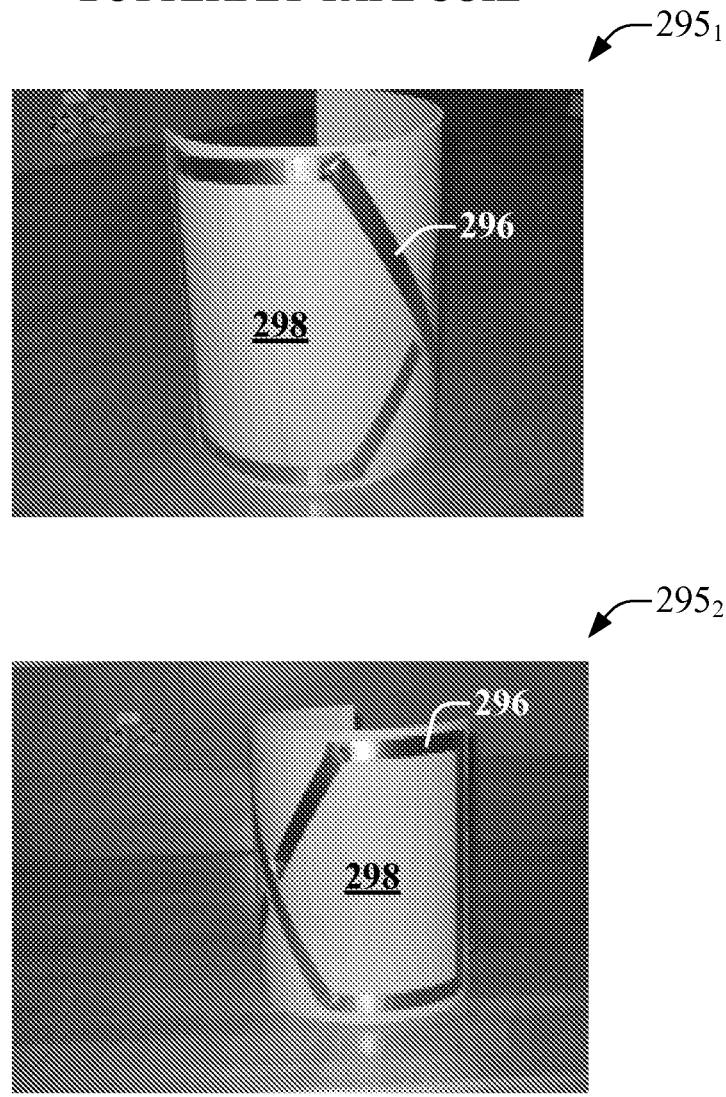

As illustrated in FIGS. 2B-2C, butterfly coils also can be manufactured out of a metal tape (e.g., copper tape) instead of a metal wire. Such metal tape-based can be produced from a modification of a single-loop tape-based coil design 250. In FIG. 2B, example single-loop tape coil 270 can be a precursor for a metal tape-based butterfly coil, and includes an insulating structure 272, an RF matching/tuning circuit 260, or inductive-capacitive (LC) matching/tuning circuitry, a coaxial cable 290, or any other link component to an excitation/detection channel. It is noted that example single-loop tape coil design 250 resonates at the Larmor frequency of $^{13}$C at 3 T. It is noted that volume coil(s) also can be constructed employing copper tapes. In FIG. 2C, a first view $295_1$ of butterfly tape coil 296 is shown, which illustrates a first loop of the coil. The butterfly coil 296 is mounted in an insulating structure 298. A second view $295_2$ of the butterfly coil presents a second loop of butterfly coil 296. Butterfly tape coil 296 can be tuned to resonate at 3 T for at least $^{13}$C and $^{23}$Na Larmor frequency, and displays good sensitivity (−25 dB on a network analyzer).

Coaxial cable 140 interfaces an RF tuning/matching circuit 210 (FIG. 2A) coupled to the butterfly coil 120 to an RF analyzer component that is part of an excitation/detection component. To improve increasing signal-to-noise ratio (SNR) in detection of signal collected by butterfly coil 120, length of coaxial cable 140 is determined at least in part by Larmor frequency of a nucleus for which nuclear magnetic resonance is to be probed through the butterfly coil; the length of the coaxial cable is typically half-wavelength at Larmor frequency, for $^{13}$C at 7 T the half-wavelength is 1.5 meters. The RF tuning/matching circuit can include a set of capacitors connected in parallel or series configuration with butterfly coil 120 connected to the circuit as an inductive element.

The butterfly coil example design 200 generates an RF-driven probe magnetic field $B_1$ that is nearly normal to the surfaces enclosed by loops $125_A$ and $125_B$, as pictorially indicated in FIG. 2A with an arrow labeled $B_1$. Spatial uniformity of generated magnetic field $B_1$ can be qualitatively assessed from quality of images of a phantom sample, which can be a fluid mixture of saline solution and oil, or soft tissue such as a piece of animal meat.

In example heteronuclear coil system 100, the volume coil 130 (e.g., tuned to detect signal from $^1$H) is a volume transmit/receive coil constructed with three parallel circular copper loops that are equally spaced by a distance (h) of 4.2 cm. Volume coils, such as volume coil 130, can serve as receive coil(s) if body coil (e.g. commercially available at 3 T and 1.5 T) or other coils are used for RF transmission. Likewise, butterfly coil(s), such as butterfly coil 120, can also serve as a receive coil(s) if a transmit coil(s) is employed. Upon driving volume coil 130 with an RF current, a probe RF magnetic field $B_1$ develops and oscillates, at the driving radio frequency, on the axis of the coil. From MRI experiments on a phantom it has been determined that $B_1$ is substantially uniform (see below). In one embodiment, each loop has a diameter (d) of 15 cm, and includes three equal wire segments (per loop) intercepted with two capacitors with a total capacitance (in a loop) of 1.6 pF, 2.2 pF, and 2.2 pF, respectively, for the upper, middle, and lower loop. It should be appreciated that said capacitors can be mounted in alternative configurations. Additionally, the number and configuration of capacitors that is employed depends on the magnetic field at which the volume coil 130 is set to operate; for instance, a $^1$H volume coil 130 operating at 7 T includes three pairs of capacitors, whereas a similar $^1$H volume coil operating at 3 T or 1.5 T can operate without capacitors. Volume coils that operate at 7 T also have been constructed with 7 copper loops without segmenting capacitor. It is to be noted that the inductance of a multi-loop volume coil (e.g., FIGS. 3A-3B) is determined by the number of parallel loops and mutual inductance between the wire segments in different loops. Inductive and capacitive aspects determine a natural frequency of the multi-loop volume coil when driven by radio frequency alternating current. As in butterfly coils (e.g., butterfly coil 120), in a multi-loop volume coil the magnitudes of d and h are determined by specific application (e.g., external magnetic field, frequency of nuclei to be probed, and so on) and QOO parameters.

It should be appreciated that butterfly coil 120 and volume coil 130 can be operated in disparate channels within an excitation/detection component. Furthermore, multiple channels can be used in case, or an embodiment in which, more than two coils comprise the heteronuclear coil system 100. It should also be appreciated that matching/tuning circuit design can be effected in a manner that allows utilization of a single RF channel within excitation/detection component. As an example, a $^1$H volume coil and $^{13}$C butterfly coil can be tuned for detection at a specific magnetic field, e.g., 3 T.

Figure 3A:
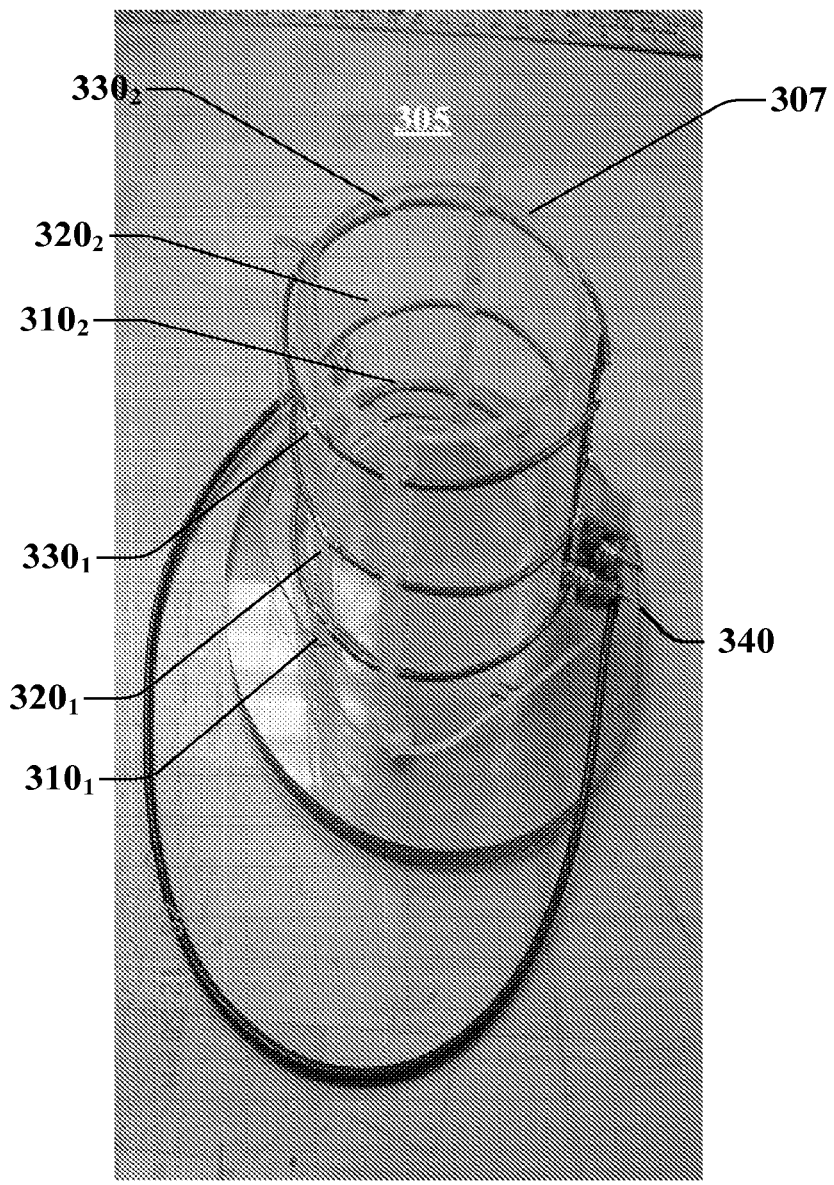
FIGS. 3A-3C illustrate example volume coils that can be employed in heteronuclear coil system(s) in accordance with aspects described in the subject specification.

FIG. 3A, illustrates an example $^1$H volume coil 305 that operates at 7 T, capacitors (e.g., $310_1$ and $310_2$; $320_1$ and $320_2$; and $330_1$ and $330_2$) have substantially the same capacity of 0.5 pF. Each loop in the volume coil 305 has a diameter of 15 cm, and spacing among loops is 4.5 cm. As described above, for structural support, the copper loops in both coils 130 and 305 are mounted, respectively, on plastic tubes of 12.5 cm in length and 10.8 cm (tube 307) of internal diameter, respectively.

Figure 3B:
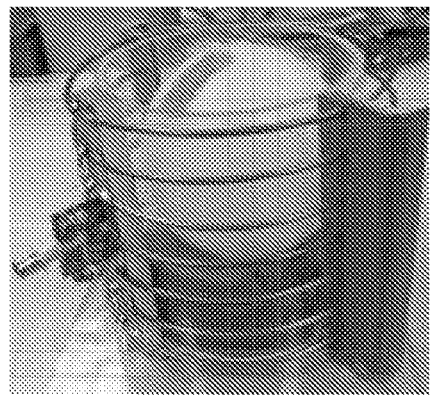
Figure 3B:
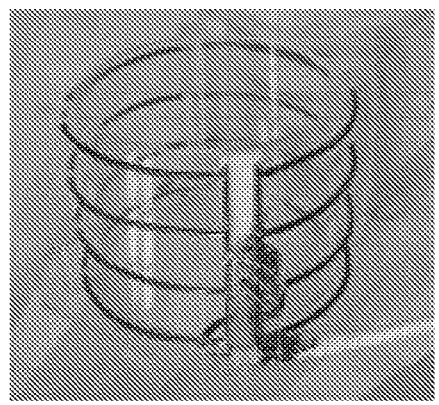
Figure 3B:
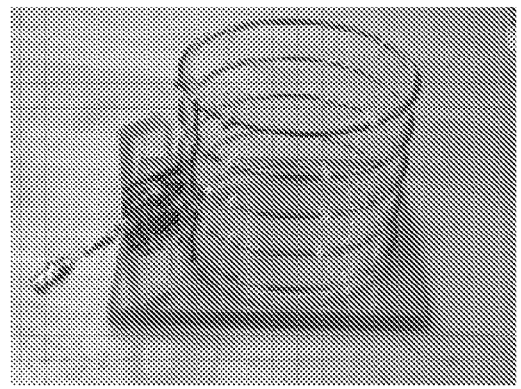

It is noted that, in an aspect of the subject innovation, multi-loop $^1$H volume coils can comprise multiple loops, and 3-loop $^1$H volume coil 305 is an example realization. The number of loops depends on the magnetic field at which the coil is designed to operate, and other structural parameters like loop size(s) (e.g., radius, ellipticity, eccentricity) and inter-loop spacing. FIG. 3B illustrates a set of three multi-loop volume coils designed to resonate at disparate $^1$H Larmor frequencies for disparate magnetic fields. Volume coil 360 resonates at the $^1$H Larmor frequency ($v_L$) at 1.5 T and is manufactured to operate with 7 loops of coaxial copper wire; volume coil 370 resonates at 3.0 T, and volume coil 380 at 9.4 T. It should be noted that each volume coil in the set is supported through a plastic tubular structure.

The N-loop coil inductance $L_N=(1/N)\times(A/l)$; a factor of N smaller than the inductance in a single loop. A smaller inductance can increase the resonance frequency of the coil when connected in an inductive-capacitive (LC) RF circuit (matching/tuning circuit 340) and driven by an RF current. In the foregoing expression for $L_N$, l is the length of a loop in the solenoid (e.g., coil), and A is the area of the loop. Matching/tuning circuit 340 is attached to the coil to couple it to RF analyzer component that is part of an excitation/detection component. Variable capacitors (with capacities between 10-50 pF) in a matching/tuning circuit facilitate tuning the resonance frequency of the coil (see below). Probing the $^1$H volume coil 130 with a network analyzer, or RF analyzer component, yields a resonance frequency of 297.02 MHz, while the proton Larmor frequency $v_0^{(p)}$ at 7 T is 297.02 MHz. Moreover, the quality factor of volume coil 130 is approximately 38.

Figure 3C:
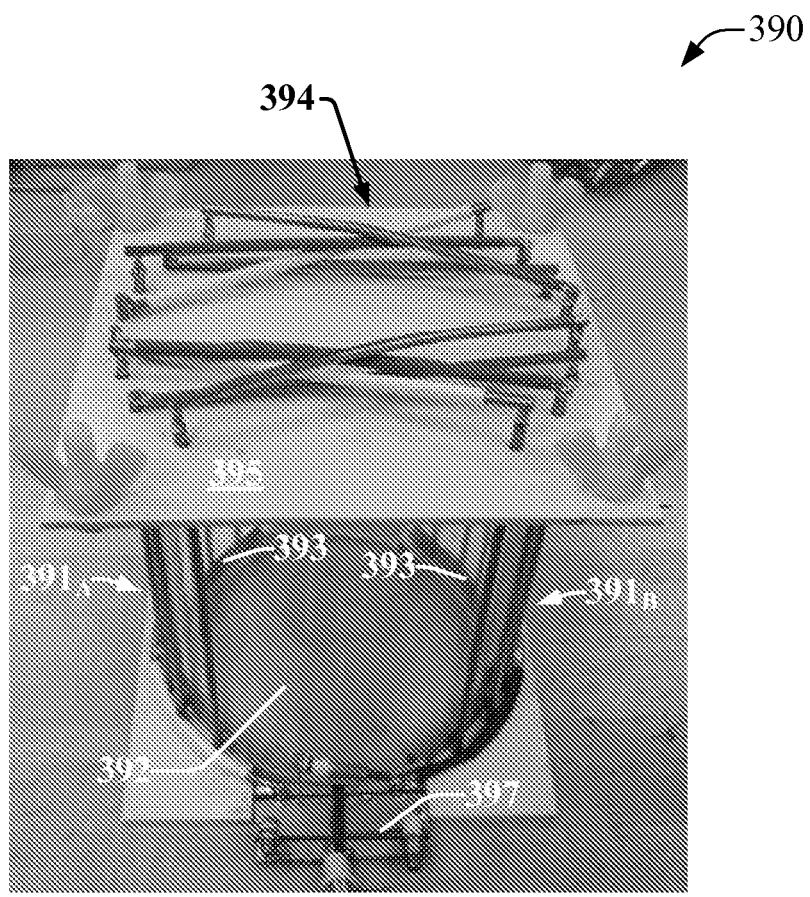

FIG. 3C illustrates an alternative or additional example volume coil 390 that can be employed in a heteronuclear coils system in accordance with aspects described herein. It is noted that to utilize volume coil 390 as a part of a heteronuclear coil system (e.g., heteronuclear coil system 100), active decoupling may be necessary in view of the orientation of the excitation $B_1$ field that volume coil 390 generates. Volume coil 390 can operate at 3 T or 1.5 T, and possibly at 7 T, and can be tuned to detect signal from at least $^1$H, $^{13}$C, and $^{23}$Na. Volume coil 390 is a realization of a parallel cosine coil design (PCOS), and generates an excitation $B_1$ field normal to the axis of the coil. Volume coil 390 includes a first group of metal wires 391A and a second group of metal wires $391_B$, both groups deployed parallel to the surface of a plastic cylinder 392. An LC tuning/matching circuit 397 facilitates at least in part to tune the volume coil 390 to resonate at a specific Larmor frequency. Metal tapes 393 connect each group of metal wires on a first end of volume coil 390. On a second end of volume coil 390, wires from disparate groups $391_A$ and $391_B$ are connected via a set of metal wires 394 so as to form loops with surfaces equalized and surface normal vectors that are orthogonal to the axis of the coil; connection includes capacitors at each joint pair of wires to minimize Eddy currents; the second end of volume coil 390 is covered with an insulating cap 395.

Figure 4A:
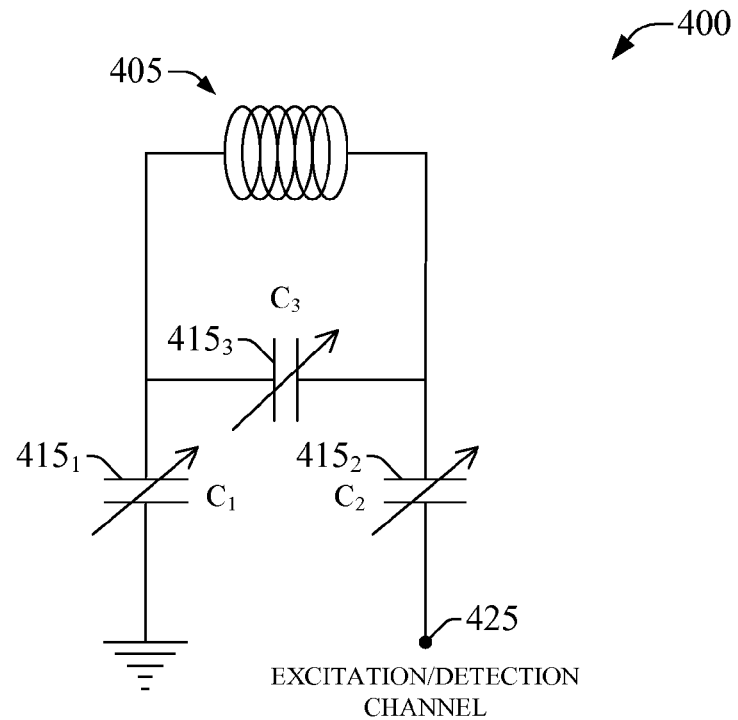
FIGS. 4A and 4B illustrate diagrams of LC matching/tuning circuits that can be employed to operate a heteronuclear coil system for magnetic resonance spectroscopy and imaging in accordance with aspects described herein.
Figure 4B:
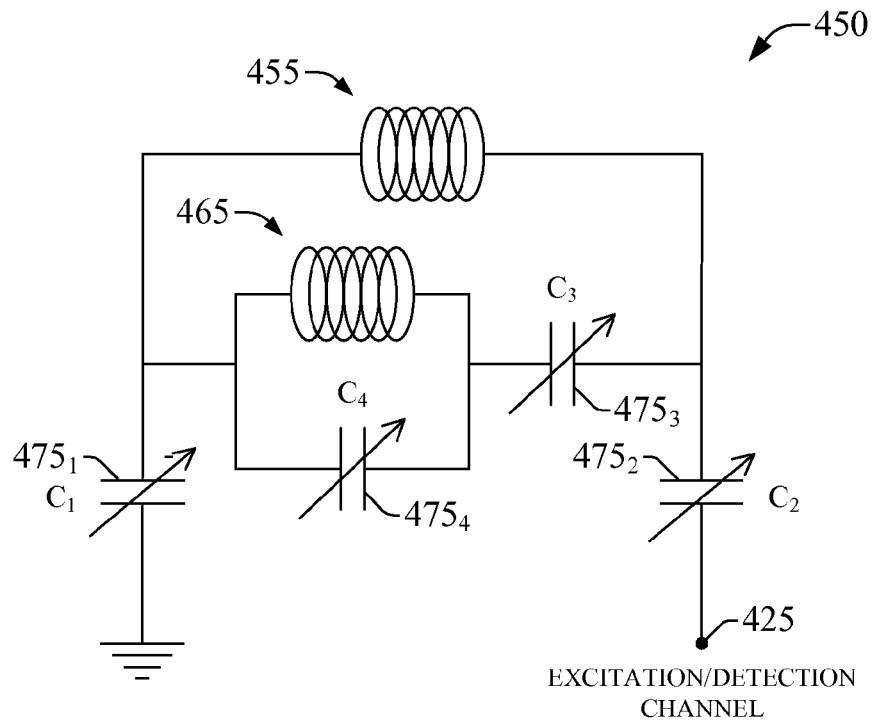

FIGS. 4A and 4B illustrate diagrams of LC matching/tuning circuits 400 and 450, respectively, that can be employed to operate a heteronuclear coil system for magnetic resonance spectroscopy and imaging in accordance with aspects described herein. In LC tuning/matching circuit 400, three adjustable capacitors provide matching and tuning: An adjustable tuning capacitor $C_3$ $415_3$ with a capacitance of up to 40 pF connected in parallel with inductive element 405, and two adjustable matching capacitors $C_2$ $415_2$ and $C_1$ $415_1$ of up to 15 pF connected in series with inductive element 405; matching capacitors minimize impedance mismatch between coil and tuning portion of LC matching/tuning circuit 400. A coil, e.g., a butterfly or volume coil, embodies inductive element 405. A leg of the LC matching/tuning circuit 400 is grounded, while the other ends in an excitation/detection channel 425. These capacitors are used to match natural resonance of a coil 405, when driven by an RF current, to a Larmor frequency for a selected nucleus at a specific static external magnetic field.

It should be appreciated that in a heteronuclear coil system, each coil therein can be matched or tuned through an LC matching/tuning circuit 400. In addition, each coil utilizes a channel in an RF analyzer component that is part of an excitation/detection component that operates the heteronuclear system. As an example, LC matching/tuning circuit 400 can tune butterfly coil 120 to resonate, when RF current drives the coil, with the $^{13}$C Larmor frequency $v_0^{(C)}$ at 7 T. Employing a network analyzer, which can be an embodiment of an RF analyzer component within an RF excitation/detection component, the resonance frequency $(v_B \sim (1/2\pi) \times (L\,C_3)^{-1/2})$ of butterfly coil 120 is tuned to 74.67 MHz, which is within 0.5% of the $v_0^{(C)}=74.97$ MHz, the Larmor frequency for $^{13}$C at 7 T.

In LC tuning/matching circuit 450, two inductive elements, each embodied in a coil as described herein, are connected to four adjustable capacitors. Capacitors $C_1$ $475_1$ and $C_2$ $475_2$ are matching capacitors, and are connected in series to a double-tune LC pair; namely, first coil 455 electrically connected to a first adjustable capacitor $C_3$ $475_3$, and second inductive element 465 (e.g., an inductor loop) connected to a second adjustable capacitor $C_4$ $475_4$. It is to be noted that the double-tune LC matching circuit 450 utilizes a single coil that is driven by the first or the second channel of an excitation/ detection component, which detects signal there from. As an example, capacitor $C_3$ 475$_3$, with capacitance contributions from $C_4$ 475$_4$ in conjunction with inductive element 465, can be employed to tune coil 455 to resonance Larmor frequency of $^1$H, while adjustable capacitor $C_4$ 475$_4$ can be utilized to tune coil 455 to resonance Larmor frequency of $^{13}$C. As another example, capacitor $C_3$ 475$_3$ can be employed to tune coil 455 to resonance Larmor frequency of $^{19}$F, while the $C_4$ 475$_4$, in parallel with inductive element 465, can be employed to tune coil 455 to resonance Larmor frequency of $^{23}$Na. It should be appreciated that LC tuning/matching circuit 450 can facilitate to tune a single coil (e.g., a butterfly coil, a volume coil) to resonate at two disparate frequencies, which are related to resonance Larmor frequency for disparate nuclei.

It should be appreciated that design of the double-tune LC tuning/matching circuit 450 can be extended to include additional LC pairs to tune or match additional Larmor frequencies of different nuclei, or to employ multiple coils in parallel imaging through utilization of multiple transmission, or excitation, channels which can be part of an excitation/detection component. In such extension additional inductor-adjustable capacitor pairs are added in parallel to the last tier in a multi-tune scheme. For example, in a triple-tune LC matching/tuning circuit, a parallel arrangement of a third inductor-variable capacitor is added in series to capacitor $C_4$ 475$_4$. In such configuration, an additional Larmor frequency resonance can be tuned in addition to the two resonances that can be tuned for coil 455. It should be appreciated that in a multi-tune LC matching/tuning circuit for a heteronuclear coil system with more than two inductive elements, coil sensitivity as detected in a detection channel (e.g., channel 425) through a multi-tune LC matching/tuning circuit typically decreases for each inductor-variable capacitor addition. As discussed above, multi-tune LC matching/tuning circuitry can facilitate to tune a single coil to resonate at multiple Larmor frequencies at a specific magnetic field.

FIG. 5A illustrates magnetic resonance images of phantom obtained with a with a butterfly coil tuned to $^1$H Larmor frequency resonance at 1.5 T, which is substantially equivalent to the $^{13}$C Larmor frequency resonance at 7 T, to test spatial uniformity, or homogeneity, of probe $B_1$ magnetic field. Phantom 510 is a mixture of 50% oil and 50% water, as a model of fat-water composition in soft tissues, contained in a flask with a diameter of 8 cm. Slices in the images are 1.5 mm wide; slices within the same plane class (e.g., axial, transverse, sagittal, coronal) are spaced by 0.5 mm. Image 520 corresponds to a sagittal slice of the phantom. Water phase and oils phase can be clearly resolved. Images 530, 540, and 550 are slices in a transverse plane. Image 530 presents a phantom slice at the oil phase. The image indicates satisfactory uniformity of the excitation magnetic field ($B_1$) generated with the $^{13}$C butterfly coil. Image 540 corresponds to a phantom slice in the water region, which can be distinguished from image 530. Uniformity in image 540 also is satisfactory. Image 550 is taken in a slice at the interface between oil and water; oil rich areas can be identified as dark spots, while water rich areas have lighter tone. Inhomogeneities in the image contrast can be related to air bubbles formed at the oil-water interface.

FIG. 5B illustrate MRIs of the liquid phantom 510 taken with a volume coil tuned to Larmor frequency of $^1$H at 7 T. Image 560 presents a sagittal cut of the phantom; the image clearly reveals the oil/water phases of the phantom and air bubbles at the interface, which appears are dark, spotty inhomogeneities. Images 570 and 580 are traverse-plane measurements in the oil phase and water phase, respectively. All three images in FIG. 5B reveal substantive homogeneity of excitation field generated with the employed volume coil. It should be appreciated that the image 580 of water phase presents the expected dielectric effect (e.g, darker outer boundaries in the image of the phantom due to a reduced RF wavelength as a result of high dielectric constant of water). However, breast tissue has a dielectric constant close to the oil dielectric constant, which is lower than dielectric constant of water, and thus breast images acquired employing the $^1$H volume coil can provide a homogeneous, or uniform, $B_1$ field without a strong dielectric effect.

FIG. 5C is a sagittal-slice image of a soft tissue phantom, which is an animal meat phantom 590. Image resolution is substantially high, and indicates uniformity of excitation field and high signal-to-noise ratio as presented by the high contrast of the image.

Figure 6:
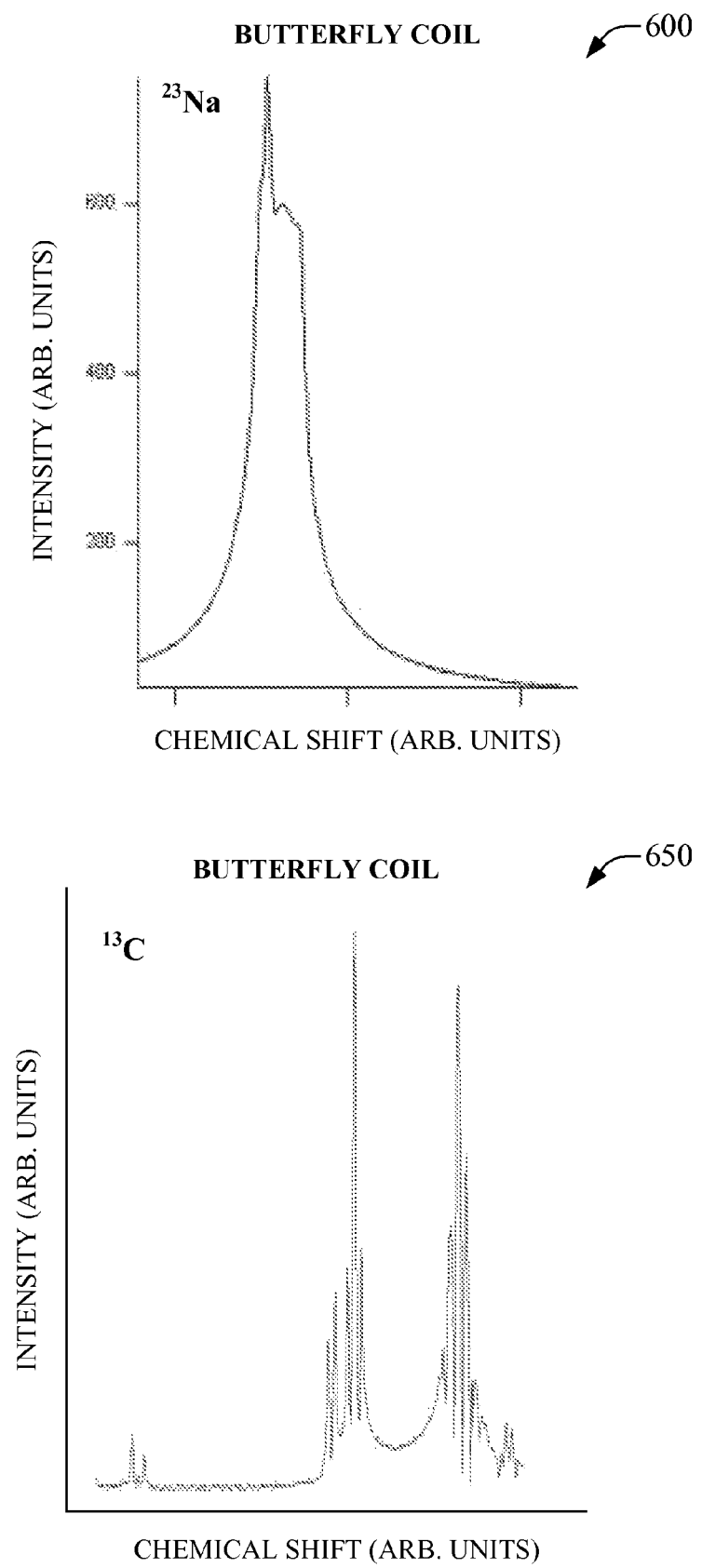
FIG. 6 presents illustrative measurements of a phantom in MR spectroscopy mode conducted with a butterfly coil tuned to resonance at the Larmor frequency at 7 T for $^{23}$Na and $^{13}$C in accordance with aspects described herein.

FIG. 6 presents illustrative measurements of chemical shift from a phantom in MR spectroscopy mode conducted with a butterfly coil tuned to resonance at the Larmor frequency at 7 T for $^{23}$Na and $^{13}$C. Chemical shift provides information of the environment of a nucleus (e.g., $^{23}$Na, $^{13}$C) to which coil resonance is tuned to in view of variations of the nucleus spin with its environment and other nuclei. Healthy tissue environment of a nucleus provide different concentrations of a set of chemicals, each chemical with specific chemical shifts. The set of chemicals in cancerous environments are mostly the same as in healthy tissue, and thus have exhibit most the same chemical shift, but concentrations of each chemical in the set of chemicals are different than in healthy tissue. Accordingly, chemical shift intensity measurements reveal different profiles of intensity affected primarily by concentration of chemicals, the concentration affected by compounds present in cancerous tissue. Plot 600 illustrates $^{23}$Na chemical shift signal intensity from a phantom embodied in a 500 mL bottle of 1M NaCl solution detected using the butterfly coil tuned at 78 MHz. Measurements were performed without shimming in 64 scans on a 7 T Siemens MRI scanner. Repetition time for excitation has been set to TR=550 ms, while echo time TE=0.35 ms. Plot 650 illustrates chemical shift for $^{13}$C signal intensity from an oil phantom detected using the butterfly coil tuned at 75 MHz. Repetition time and echo time are substantially the same as the aforementioned TR and TE.

Figure 7:
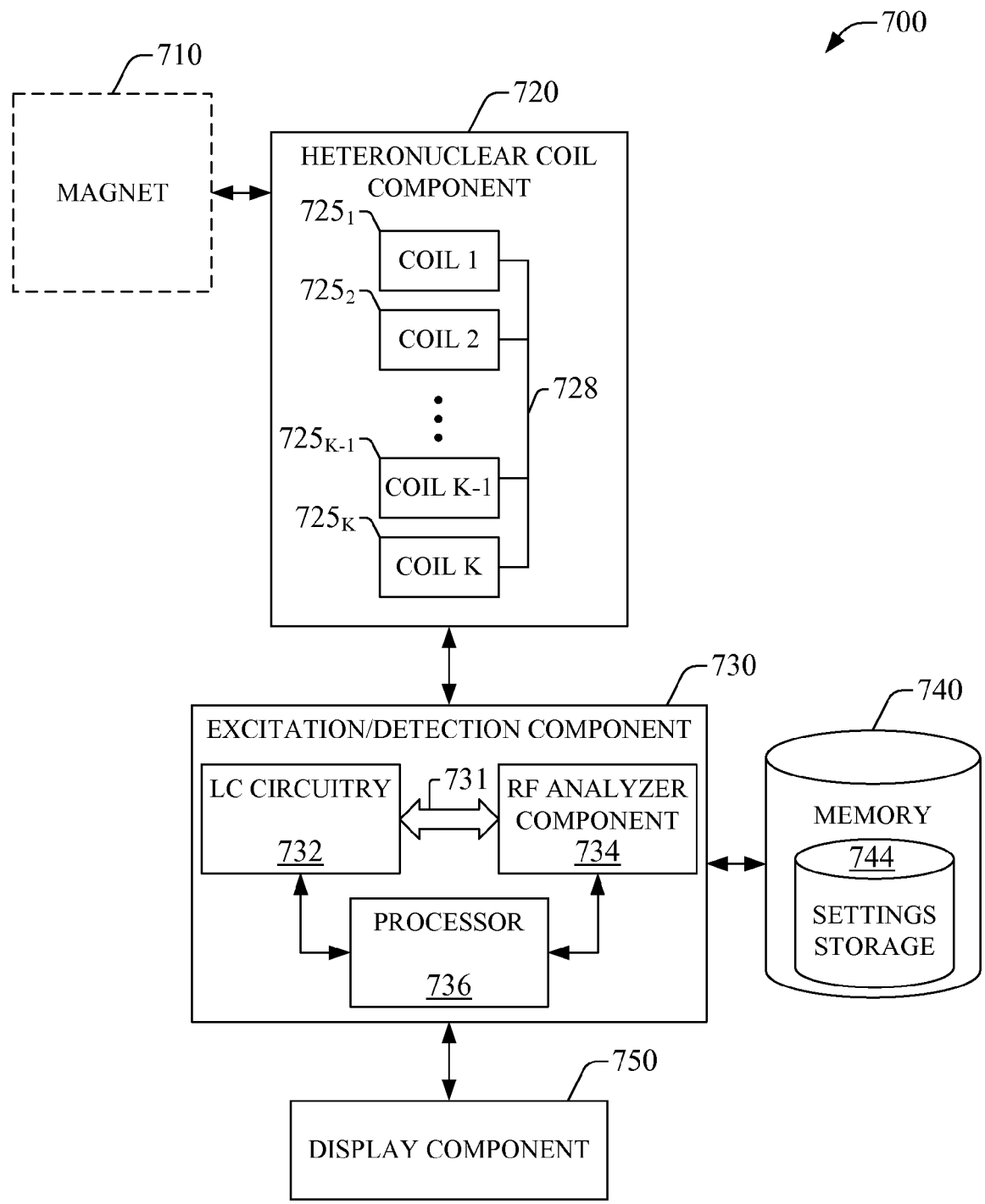
FIG. 7 is an example system that facilitates chemical analysis of soft tissue based at least in part on a heterogeneous coil system in accordance with aspects described herein.

FIG. 7 is an example system that facilitates chemical analysis of soft tissue (e.g., breast tissue, muscle or joint tissue) disease through a combination a heteronuclear coil system (e.g., heteronuclear coil system 100) with magnetic resonance spectroscopy (MRS) or imaging (MRI), or magnetic resonance spectroscopic imaging (MRSI) methods. Chemical analysis can include monitoring chemical changes in breast tissue indicative of cancerous tissue, such as decreased levels of polyunsaturated fatty acids (PUFAs), by selectively detecting certain chemicals that contain the nuclei for which the heteronuclear coil system has been designed. Detection employing heteronuclear coils generally targets presence of NMR-detectable chemicals specific to cancerous breast tissue to improve breast cancer diagnostic specificity. Additionally, a heteronuclear coil system (e.g., heteronuclear coil system 100) can be used generally for other breast diseases and studying healthy and abnormal breast physiology in vivo. It should be appreciated that other chemicals can be monitored as indicators of cancer. The heteronuclear sensitivity of heteronuclear coil system 100 tuned to $^1$H/$^{13}$C nuclei, for example, also can provide for studying carbon signals from disparate, abundant molecules in healthy and cancerous breast tissues, including anti-cancer drugs. As indicated above, such a chemical sensitivity originates from the multiple chemical couplings between carbon and a proton in a compound. It is to be noted that for other nuclei combinations, the various chemical couplings between a first and second nuclei in a combination result in the sought after chemical sensitivity to detect breast disease.

Heteronuclear coil system 100, with suitable $N_A/N_B$ combinations of nuclei sensitivity can be employed for chemical analysis of lipids and metabolites in vivo, like the glucose molecule and its metabolic products, polyunsaturated fatty acids, etc. Additionally, the heteronuclear coil system 100 can be modified to observe substantially any NMR sensitive nuclei in addition to $^1$H and $^{13}$C, such as sodium signals ($^{23}$Na), fluorine signals ($^{19}$F) in anti-cancer drugs such as 5-FU, and phosphorous ($^{31}$P) signals, which were the first NMR modality signals to demonstrate that MRS can detect tumor metabolites that are different from normal tissues.

Generally, chemical structure, chemical content, and chemical reactivity can be discriminated with a heteronuclear coil system (e.g., heteronuclear coil system 100) based on chemical bonding. Chemical reactions between drugs and cancerous tissue can be monitored by a suitable choice of nuclei $N_A$ and $N_B$. It is noted that more comprehensive combinations of nuclei can be established in heteronuclear coil systems that include more than two coils, or heteronuclear coil systems with multi-tuned constituent coils. Similarly, chemical interaction between compounds in cancerous and healthy breast tissue can be analyzed, as well as chemical reactivity of a compound in healthy tissue and cancerous tissue. It should be appreciated that chemical analysis can be essential to understanding breast cancer in view of the variety of metabolic changes expressed from individual to individual.

In an aspect of the subject innovation, chemical characterization as provided by the heteronuclear coil system (e.g., heteronuclear coil system 100) described herein, can be directed not only to diagnosis of soft tissue (e.g., breast tissue, joint tissue) disease(s) but it can be directed to monitoring treatment thereof. Regarding treatment, chemical characterization through magnetic resonance spectroscopic imaging as facilitated via the heteronuclear coil system(s) described in the subject innovation can be employed to monitor efficacy of a treatment regimen by detecting the biochemical activity of a tumor. It is to be noted that generally when a treatment drug is going to be therapeutically effective, biochemical activity of a target tumor changes shortly after implementation of the treatment drug. Thus, chemical characterization via MRSI can provide almost immediate feedback in connection with treatment effectiveness, which can allow physicians to switch medications (e.g., treatment drugs) when a current medication fails to show improvement in connection with attacking the tumor, or any other soft tissue disease for which the treatment drug is directed to. At least one advantage of such expedited feedback, provided by a heteronuclear coil system of the subject innovation is that decision making time regarding change(s) from an ineffective drug to an effective drug is greatly reduced, with the ensuing increase in treatment outcomes.

To conduct chemical analysis and MRI, example system 700 comprises a magnet 710 that provides an external field ($B_0$), a heteronuclear coil component 720 that includes a set of K coils $725_1$-$725_K$ (K is a positive integer) that provides sensitivity to a set of nuclei $n_1, n_2, \ldots n_{K-1}, n_K$. Coils $725_1$-$725_K$ can be functionally coupled through a coupling element 728; the coupling element can facilitate mechanical coupling, electrical coupling, electronic coupling, electromagnetic coupling, or any combination thereof. Such coupling can be adjusted for operational selectivity, e.g., selection of pair of coils that are active for determined measurement(s). Coils $725_1$-$725_K$ can include volume coils and butterfly coils. In addition, the set of K coils can be employed as a multi-coil array system for excitation/detection, wherein a subset of coils includes transmitter coils and a second subset of coils includes receiver coils; each coil in either set driven by a single channel in an excitation/detection component (e.g., component 730). As an example, for K=2, heteronuclear coil component can employ a butterfly coil (e.g., butterfly coil 120) and a volume coil (e.g., volume coil 130) for chemical discrimination, based upon nuclei interaction in an environment and related chemical shift measured through NMR. It should be appreciated that heteronuclear coil component 720 embodies at least in part heteronuclear coil system 100. Example system 700 can include an excitation/detection component 730 coupled to a settings storage 744 that resides within a memory 740. In addition, example system 700 includes a display component 750 for analysis and manipulation of data.

Excitation/detection component 730 can include LC circuitry 732 which includes RF matching/tuning circuitry as discussed above, which can be employed to automatically tune the resonance Larmor frequencies for selected nuclei $n_A$ and $n_B$ (when K=2) at the operation external magnetic field ($B_0$) provided by magnet 710. In addition, component 730 can include RF electronics, e.g., included within LC circuitry 732, to generate a sequence of applied pulses (e.g., $\pi/2$ and $\pi$ pulses), which typically employ application of multiple pulses at specific time intervals such as TE and TR, in order to accomplish specific coherent excitation of nuclear spin targets for monitoring and detection of spin dynamics. As an example, predetermined excitation sequences such as selective single or multiple quantum coherence (Sel-MQC) or substantially any other sequence, as well as parameters relevant to MRSI experiments in particular microscopic parameters associated with a probed nuclei (e.g., spin-spin coupling constants, relaxation times ($T_1$) or decoherence times ($T_2$), echo times, repetition times) can be stored in settings storage 744. Excitation/detection component 730, through analyzer component 734, can determine slices (e.g., axial, coronal, or sagittal) for probing a human breast, or other small organs, and can also process data according to a selected weighting ($T_1$-weighting or $T_2$-weighting).

It is to be noted that LC circuitry 732 is functionally coupled to an analyzer component 734 through a link component 731 (e.g., coaxial cable 140). In an aspect, analyzer component 734 includes a network analyzer that facilitates characterization of a coil (e.g., coil $725_2$, or any other coil) resonance features. Analyzer component 734 allows direct determination of the coil quality factor (Q) and estimation of a return-loss factor for the coil. In addition, analyzer component 734 can facilitate, via a Smith chart, assessment of actual inductance and capacitance in the LC circuitry that includes the coils. Moreover, a Smith chart can facilitate to adjust the impedance between LC circuitry 732 and analyzer component 734. It should be appreciated that LC circuitry 732 can include one or more of coils $725_1$-$725_K$.

Processor 736 can confer, at least in part, functionality to one or more components of example heteronuclear coil system 700. In an aspect, processor 736 can execute code instructions in software or firmware in order to provide components with their specific functionality; e.g., a processor can execute code instructions to generate Heteronuclear Sel-MQC sequences, or any other sequence, utilized to excite one or more coils within heteronuclear coil component 720. Memory 740 can retain the code instructions in software or firmware that processor 736 can execute. In addition, memory 740 can retain settings storage 744 that includes microscopic parameters associated with operation of heteronuclear coils component and substantially any component in example system 700.

Figure 8:
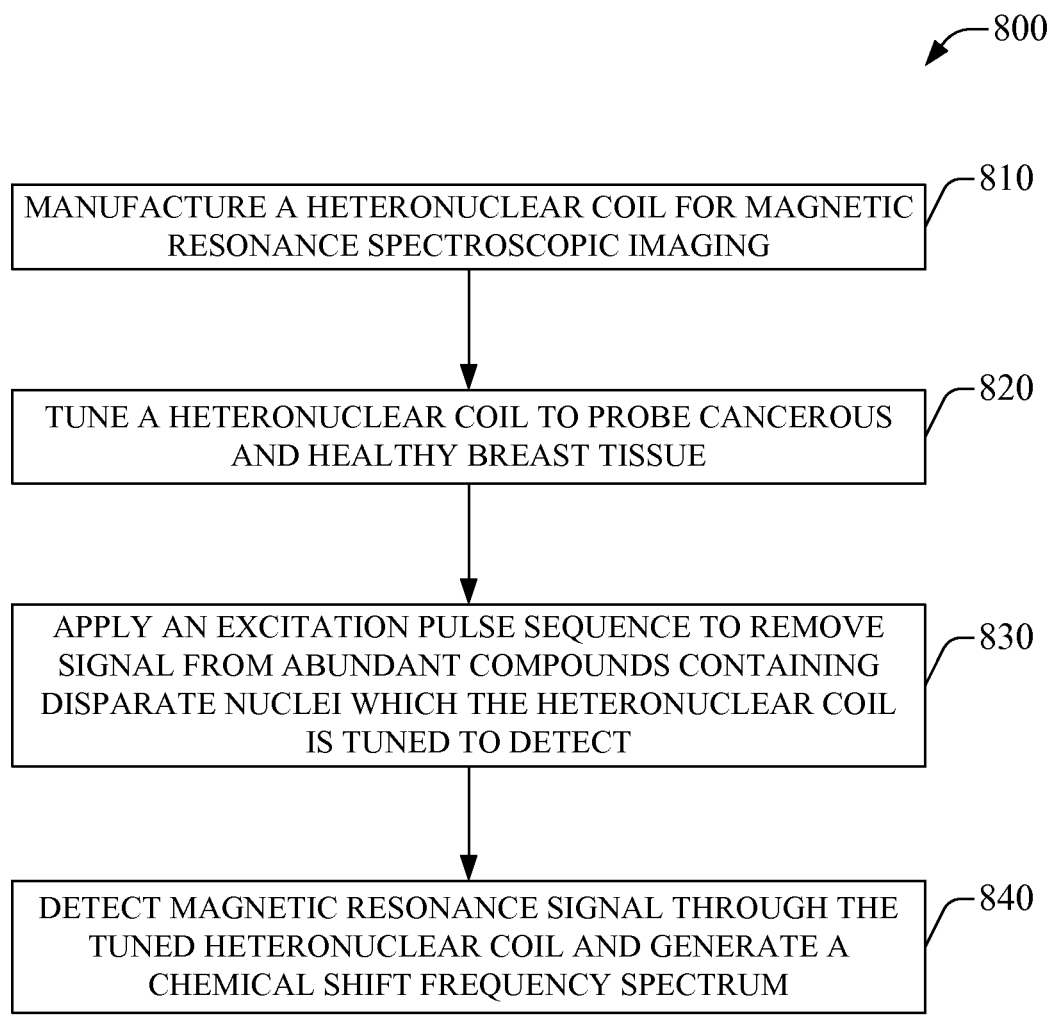
FIG. 8 presents a flow chart of an example method for analyzing chemical constituencies in healthy and cancerous breast tissue according to aspects described herein.
Figure 9:
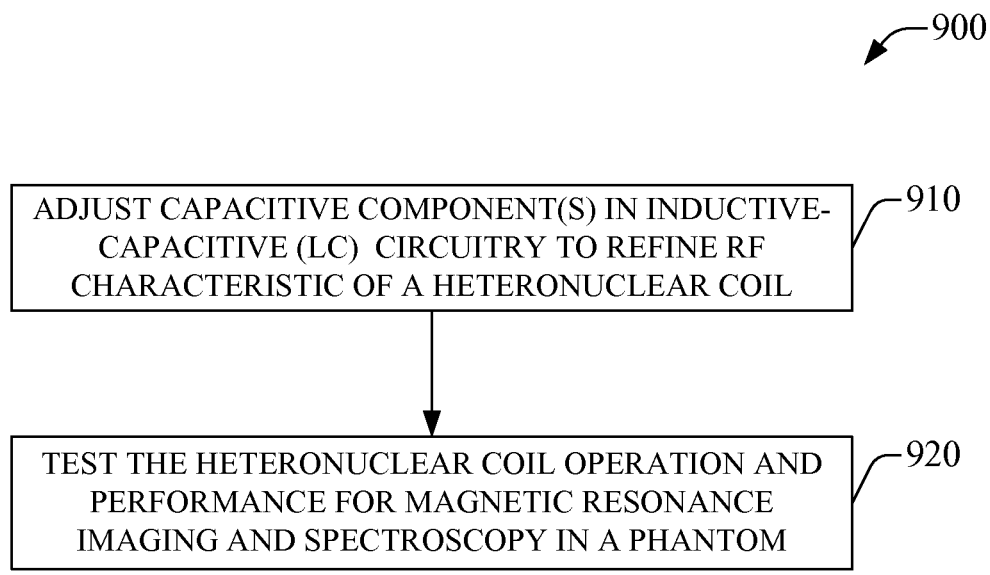
FIG. 9 is a flowchart of an example method for tuning a heteronuclear coil system in accordance with aspects described herein.

In view of the example systems shown and described above, example methodologies that may be implemented in accordance with the disclosed subject matter will be better appreciated with reference to the flowcharts of FIGS. 8 and 9. While, for purposes of simplicity of explanation, the example methodologies are shown and described as a series of acts, it is to be understood and appreciated that the claimed subject matter is not limited by the number or order of acts, as some acts may occur in different orders and/or concurrently with other acts from what is depicted and described herein. Moreover, not all illustrated acts may be required to implement the methodologies described hereinafter. It is to be appreciated that the functionality associated with the acts may be implemented by software, firmware, hardware, a combination thereof or any other suitable means (e.g., device, system, process, component). Additionally, it should be further appreciated that the example methodologies disclosed hereinafter and throughout this specification can be stored on an article of manufacture to facilitate transporting and transferring such methodologies to various devices or computers for execution by a processor or for storage in a memory. It should be understood and appreciated that a methodology could alternatively be represented as a series of interrelated states or events, such as in a state diagram or call flow.

FIG. 8 presents a flow chart of an example method 800 for analyzing chemical constituencies in healthy and cancerous breast tissue. At act 810, a heteronuclear coil system for magnetic resonance spectroscopic imaging is manufactured. The heteronuclear coil system also can be employed for MRS and MRI. Manufacture involves generation of coil loops, assembly of loops in an insulating structure, and production of LC circuitry, according to one or more designs, to excited a coil and detect signal from the coil. At act 820 a heteronuclear coil is tuned to probe healthy and cancerous tissue. The heteronuclear coil system is tuned to detect a first type of nuclei and a second disparate type of nuclei at a high magnetic field. Tuning refers to adjusting the natural resonant frequency of a coil when driven by an RF current, and includes tuning a butterfly outer coil to detect the first type of nuclei and tuning a volume inner coil to detect the second disparate type of nuclei. Tuning can proceed via inspection of various sizes and shapes for wire loops of a butterfly coil (e.g., butterfly coil 120), as well as diameters and number of loops for a volume coil, e.g., volume coils 130, 305, 360, 370, 380, in addition to adjusting a capacitor within LC circuitry 732, as a part of RF excitation/detection component 730. At act 830, a specific excitation sequence is applied to the heteronuclear coil in order to remove signal from abundant compounds (e.g., water, lipids) containing nuclei $n_A$ and $n_B$ for which the heteronuclear coils has been tuned. As an example, one such sequence can be heteronuclear selective multiple quantum-coherence (Heteronucler Sel-MQC) transfer sequence, which can facilitate removal of MRS signal arising from $^1H$ in water and lipids. As another example, a direct or indirect polarization transfer sequence can be employed. As yet another example, a hyper-polarization sequence also can be utilized. In this scenario, when hyper-polarization sequence is utilized with $^{13}C$ detection, heteronuclear coil system may map tumor enzyme activities for breast cancer detection, resulting in improved diagnostic specificity to differentiate malignant tumors. At act 840, magnetic resonance signal is detected employing the tuned heteronuclear coil (e.g., coil system 100) and a chemical shift frequency spectrum is generated. Such detection can result in a spectrum with resonances at disparate frequencies indicative of disparate chemical environments associated with nuclei $n_A$ and $n_B$ in a probed organ. Combining the MRS data with magnetic resonance imagining can result in chemical characterization of healthy and cancerous breast tissue. In an aspect, detection of magnetic resonance in this act 830 can be directed toward diagnosis of soft tissue (e.g., breast tissue, joint tissue) disease(s) or monitoring of treatment thereof. With respect to treatment, act 830 can be enacted to monitor efficacy of a treatment regimen by detecting, via MR, the biochemical activity of a tumor. It is to be noted that generally when a treatment drug is going to be effective, biochemical activity of a target tumor changes shortly after implementation of the treatment drug. Thus, detection of MR as described in connection with act 830, can provide almost immediate feedback in connection with treatment effectiveness, which can allow physicians to switch medications (e.g., treatment drugs) when a current medication fails to show improvement in connection with attacking the tumor, or any other soft tissue disease for which the treatment drug is directed to. At least one advantage of the feedback provided by the subject example method 800, and particularly act 830, is that decision making time regarding change(s) from an ineffective drug to an effective drug is greatly reduced, with the ensuing increase in patient outcomes.

FIG. 9 is a flowchart of an example method 900 for tuning a heteronuclear coil system in accordance with aspects described herein. At act 910, capacitive component(s) in inductive-capacitive (LC) circuitry to refine RF characteristics of a heteronuclear coil. Adjustment of capacitive components depends at least in part upon design of the LC circuitry. In an aspect, a multi-tune LC circuitry can demand adjustment of two or more capacitor. Tuning can be automated. At act 920, the heteronuclear coil operation and performance for magnetic resonance imaging and spectroscopy in a phantom is tested. Tests can include measurements employing various coils and combinations thereof. In an aspect, phantoms include combination of liquids that model soft tissues in humans, or animal meat(s) that can offer a better representation of fatty tissue in human breast.

The subject innovation described herein provides at least the following advantages. (i) High detection sensitivity and RF field homogeneity as compared to conventional coil systems to detect breast cancer specific biochemicals containing at least proton ($^1H$), fluorine-19 ($^{19}F$), carbon-13 ($^{13}C$), sodium-23 ($^{23}Na$), phosphorous-31 ($^{31}P$) nuclei. (ii) Broad chemical shift range for spectroscopic editing with utilization of homonuclear and heteronuclear Sel-MQC sequence at 3 T and 7 T, which permits detection of potential breast cancer specific markers unavailable conventionally. (iii) When utilized with $^{13}C$ hyper-polarization sequence, heteronuclear coils system of the subject innovation may map tumor enzyme activities for breast cancer detection, resulting in improved diagnostic specificity to differentiate malignant tumors. (iv) Provision of diagnosis of soft tissue (e.g., breast tissue, joint tissue) disease(s) or monitoring of treatment thereof.

As it employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions or acts described herein. A processor may also be implemented as a combination of computing processing units, which can be distributed or deployed in a single location or environment.

In the subject specification, the term "memory" refers to data stores, algorithm stores, and substantially any other information store relevant to operation and functionality of a component or system comprising the memory; for instance, such information can include excitation pulse sequences, capacitance values to tune a heteronuclear coil system to probe a specific nuclei, microscopic nuclei parameters relevant to MRSI such as computed or measured relaxation times and decoherence times, and so forth. It will be appreciated that the memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

Various aspects or features described herein may be implemented as a method; apparatus, either as hardware or hardware and software or firmware; or article of manufacture using standard programming and/or engineering techniques. Implementation(s) that include software or firmware can be effected at least in part through program modules stored in a memory and executed by a processor. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical discs [e.g., compact disk (CD), digital versatile disc (DVD), Blu-ray disc (BD) . . . ], smart cards, and flash memory devices (e.g., card, stick, key drive . . . ).

What has been described above includes examples of the claimed subject matter. It is, of course, not possible to describe every conceivable combination of components or methodologies for purposes of describing the claimed subject matter, but one of ordinary skill in the art may recognize that many further combinations and permutations of the claimed subject matter are possible. Accordingly, the claimed subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A coil system for detection in a magnetic resonance apparatus, the coil system comprising:
a butterfly coil tuned for excitation and detection of a first type of nuclei at a magnetic field, wherein the butterfly coil generates a first homogeneous $B_1$ field;
a volume coil tuned for excitation and detection of a second type of nuclei at the magnetic field, wherein the volume coil is attached to the butterfly coil, wherein the volume coil generates a second homogeneous $B_1$ field, wherein the second homogeneous $B_1$ field is perpendicular to the first homogeneous $B_1$ field; and
at least one of single-tune or double-tune inductive-capacitive circuitry that facilitates, at least in part, to tune the butterfly coil and the volume coil.

2. The coil system of claim 1, the butterfly coil comprises one of a single loop wired into a butterfly shape or two loops, each loop with a rectangular section with a major side and a minor side, wherein each loop includes one or more loops.

3. The coil system of claim 1, the volume coil comprises a plurality of parallel loops arranged in geometry with $C_\infty$ symmetry about an axis that pierces one of the loops through its center.

4. The coil system of claim 3, wherein the two or more loops in the plurality of loops are equally spaced along the symmetry axis.

5. The coil system of claim 3, wherein the magnetic field determines a number of segments in which each loop is segmented, the segments electrically connected with one or more capacitors.

6. The coil system of claim 1, wherein the butterfly coil and the volume coil have resonant frequencies equal, respectively, to the Larmor frequencies of the first type of nuclei and the second type of nuclei at a 1.5 T or greater magnetic field.

7. The coil system of claim 6, wherein the butterfly coil and the volume coil have resonant frequencies equal, respectively, to the Larmor frequencies of the first type of nuclei and the second type of nuclei at a 7 T or greater magnetic field.

8. The coil system of claim 1, wherein the butterfly coil has a resonant frequency equal to a Larmor frequency of at least one of $^1H$, $^{13}C$, $^{19}F$, $^{23}Na$, or $^{31}P$.

9. The coil system of claim 8, wherein the volume coil has a resonant frequency equal to the Larmor frequency of at least one of $^1H$, $^{13}C$, $^{19}F$, $^{23}Na$, or $^{31}P$.

10. The coil system of claim 1, wherein the butterfly coil has a tuning circuit comprising two or more variable capacitors.

11. The coil system of claim 1, wherein the butterfly coil and the volume coil are tuned to detect in disparate radio frequency channels.

12. A system that facilitates chemical analysis of an image object in a magnetic resonance apparatus, the system comprising:
a heteronuclear coil system component that provides excitation and detection of a first type of nuclei at a magnetic field, wherein the heteronuclear coil system comprises a butterfly outer coil that comprises at least a first loop and a second loop, wherein the first loop and the second loop are configured to be attached to surround the image object, wherein the butterfly outer coil generates a first homogeneous $B_1$ field, and wherein the butterfly outer coil provides excitation and detection of a second type of nuclei at the magnetic field, wherein the heteronuclear coil system comprises a volume inner coil, wherein the volume inner coil generates a second homogeneous $B_1$ field, and wherein the second homogeneous $B_1$ field is perpendicular to the first homogeneous $B_1$ field; and
a radio frequency (RF) excitation and detection component that drives the heteronuclear coil system and detects a signal there from, wherein the RF excitation and detection component includes at least one of single-tune or multi-tune inductive-capacitive circuitry.

13. The system of claim 12, the heteronuclear coil system component further detects a concentration of at least one chemical associated with a soft tissue disease.

14. The system of claim 12, the butterfly outer coil and the volume inner coils have, respectively, resonant frequencies equal to the Larmor frequency of the first and second types of nuclei at a magnetic field of at least 1.5 T.

15. The system of claim 14, the butterfly outer coil and the volume inner coils have, respectively, resonant frequencies equal to the Larmor frequency of the first and second types of nuclei at a magnetic field of at least 7 T.

16. The system of claim 12, wherein the first type of nuclei is the same as the second type of nuclei.

17. The system of claim 12, wherein the first type of nuclei is distinct from the second type of nuclei.

\* \* \* \* \*